(12) United States Patent
Leferink

(10) Patent No.: US 6,563,327 B1
(45) Date of Patent: May 13, 2003

(54) TEST CHAMBER

(75) Inventor: Franciscus Bernardus J. Leferink, CW Borne (NL)

(73) Assignee: Thales Nederland B.V., Hengelo (NL)

( * ) Notice: Subject to any disclaimer, the term of this patent is extended or adjusted under 35 U.S.C. 154(b) by 0 days.

(21) Appl. No.: 09/856,463

(22) PCT Filed: Nov. 26, 1999

(86) PCT No.: PCT/EP99/09216

§ 371 (c)(1),
(2), (4) Date: Jun. 7, 2001

(87) PCT Pub. No.: WO00/34795

PCT Pub. Date: Jun. 15, 2000

(30) Foreign Application Priority Data

Dec. 7, 1998 (NL) .............................................. 1010745

(51) Int. Cl.⁷ .......................... G01R 27/04; G01R 27/32
(52) U.S. Cl. ....................................................... 324/637
(58) Field of Search ................................ 324/637, 639, 324/633, 627, 663, 613, 636, 202, 204, 224, 261, 262, 27.1

(56) References Cited

U.S. PATENT DOCUMENTS

| | | | | |
|---|---|---|---|---|
| 3,978,915 A | * | 9/1976 | Harris | 165/11.1 |
| 5,327,091 A | * | 7/1994 | Loughry | 324/603 |
| 5,530,412 A | * | 6/1996 | Goldblum | 324/633 |
| 5,710,564 A | * | 1/1998 | Nimtz et al. | 342/1 |
| 6,112,596 A | * | 9/2000 | Hess | 73/663 |
| 6,295,032 B1 | * | 9/2001 | Podgorski | 343/703 |

FOREIGN PATENT DOCUMENTS

EP  0 660 122  6/1995

\* cited by examiner

*Primary Examiner*—N. Le
*Assistant Examiner*—John Teresinski
(74) *Attorney, Agent, or Firm*—Oblon, Spivak, McClelland, Maier & Neustadt, P.C.

(57) ABSTRACT

A test chamber for measuring electromagnetic radiation emitted by an apparatus to be tested or for exposing an apparatus to be tested to an electromagnetic radiation field. The test chamber includes a reverberation chamber made of a conductive tent fabric. To create a statistically uniform field in the test chamber, the test chamber is partially set into a mechanical vibration, induced by a vibrator.

14 Claims, 2 Drawing Sheets

TEST CHAMBER

BACKGROUND OF THE INVENTION

The invention relates to a test chamber in which objects to be tested can be exposed to an electromagnetic radiation field, or in which electromagnetic radiation emitted by objects to be tested can be measured, provided with means for coupling in/coupling out electromagnetic radiation and provided with means to distribute the electromagnetic radiation uniformly throughout the test chamber.

Test chambers of this type are known. They serve to verify the proper functioning of equipment exposed to a radiation field of predefined strength. Therefore, it is of importance to introduce a substantially uniform radiation field into the test chamber. A known and approved embodiment realizes a uniform radiation field by radiating a defined radiation field into one side of the test chamber and by absorbing the radiation at an opposite side. This embodiment has the drawback that high power levels are required which, particularly in case of high frequencies, is extremely costly. A further known and theoretically acceptable embodiment approximates a uniform radiation field by introducing a radiation field into a test chamber metallized on the inside and by subsequently creating an at least statistically uniform field by means of a stirrer. This method entails the drawback of being very time-consuming, because each measurement has to be averaged out during at least one stirrer revolution.

SUMMARY OF THE INVENTION

The inventive test chamber obviates this drawback to a significant extent and is characterized in that the test chamber possesses a reverberation chamber-geometry, that the test chamber walls are made of an electrically-conductive material, and that the means for the uniform distribution of the electromagnetic radiation are designed to move, in an operating mode, at least one part of a wall.

An advantageous embodiment according to an aspect of the invention that is relatively simple to realize is characterized in that the means for moving at least one part of a wall are designed to cause at least one part of a wall to vibrate.

An advantageous embodiment according to a further aspect of the invention is characterized in that the wall is made of a conductive fabric. This enables an apparatus to be field-tested with the test chamber built around the apparatus to be tested. This obviates the need to test the apparatus in a laboratory environment which causes a substantial reduction of expenses, since there are no cost arising from transportation or laboratory testing, the latter often requiring an environment comprising additional equipment, special-purpose cables, power supplies and the like.

An advantageous embodiment according to a further aspect of the invention is characterized in that the reverberation chamber is realized as a tent. In this embodiment, the conductive fabric can advantageously be provided with conductive slide fasteners, so that the tent can simply be set up around the apparatus to be tested. If required, it is possible to remove a part of the tent's lower edge, causing it to abut against a metal plate or foil, preferably placed underneath the apparatus to be tested.

A further advantageous embodiment of the invention is characterized in that a frame is provided within which the reverberation chamber can be suspended from the frame's corner joints. This embodiment, well-known in the field of tent constructions, entails the advantage that the test chamber does not require any supporting means.

A further advantageous embodiment of the invention is characterized in that the tent is provided with a connection for a pressure gas, for creating an overpressure in the tent. Also this embodiment, well-known in the field of tent constructions entails the advantage that the test chamber does not require any supporting means. Additional advantages in this respect are that the test chamber can be set up in a relatively short time and that the gas flow, usually air, ensures a good ventilation in the tent.

A further advantageous embodiment according to an aspect of the invention is characterized in that the means for moving at least one part of a wall are realized as a vibrator, in the operating mode attached to one of the tent's corner joints. In an advantageous embodiment, drive means are provided for actuating, in the operating mode, the vibrator at a frequency of 5–20 Hz.

BRIEF DESCRIPTION OF THE DRAWINGS

The invention will now be explained in greater detail with referee to the following figures, of which.

DETAILED DESCRIPTION OF THE INVENTION

Figure 1:
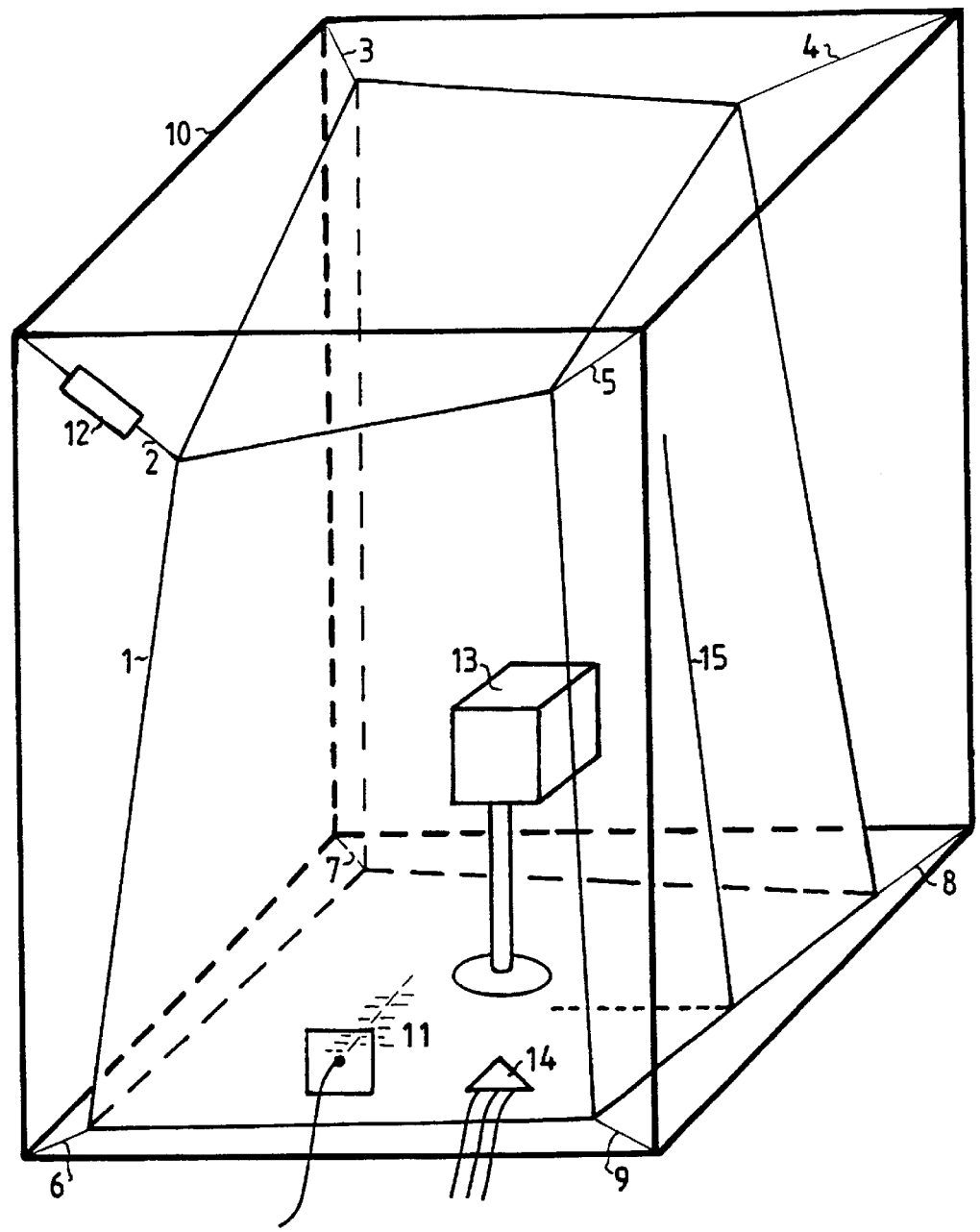
FIG. 1 represents a first possible embodiment of a test chamber according to the invention.

FIG. 1 shows a first possible embodiment of a test chamber 1 according to the invention, which test chamber 1 is realized as a tent made of woven aluminium fabric, which material is known to be an excellent reflector of electromagnetic radiation. Test chamber 1 is attached to a metal frame 10 by means of straps 2,3,4,5,6,7,8,9. Test chamber 1 possesses a reverberation chamber-geometry, which means that i.e. no two walls are parallel, that at most one wall is placed perpendicular to another wall, that the average distances between two opposite tent walls vary and mutual multiples do not apply. In this situation, no eigenmodes exist in test chamber 1, causing a substantially uniform distribution of the electromagnetic energy injected into test chamber 1 by means of a wideband antenna 11. Measurements, however, reveal that the electric field strength measured at a random point within test chamber 1 may vary significantly with the frequency as provided by antenna 11. Strap 2 is therefore provided with a vibrator 12, known in the art, which causes one of the corners of test chamber 1 to vibrate at a frequency of 10 Hz. These vibrations particularly serve to smooth out the sharp nulls present in the field which, from a statistical point of view, significantly improves the uniformity of the electric field strength.

To enable a measurement on an apparatus 13 placed in test chamber 1, antenna 11 is connected to a tunable transmitter or receiver, which is sweeped very slowly while transmitting or receiving within a certain bandwidth. In this respect it should be noted that tuning shall proceed so slowly that a sufficient statistical average value of the field is obtained. To this end, conventional test chambers are provided with a field stirrer which makes at most one revolution per second and for which an integration time of at least one second should be taken. In the novel test chamber which vibrates at a frequency of approximately 10 Hz, the integration time can be reduced to approximately one tenth of a second which yields a considerable gain in time.

Test chamber 1 furthermore comprises a cable feedthrough 14 and a slide fastener 15 made of a conductive material, which facilitates the installation of the apparatus 13 to be tested. Additionally, it may be advantageous to implement test chamber 1 with an opening (not shown) in the centre of the ground sheet. Apparatus 13 can first be positioned on a metal plate (not shown), after which test chamber 1 can be set up around apparatus 13. To ensure a good contact between metal plate and aluminium ground sheet, several weights can be placed on the ground sheet near the opening.

Figure 2:
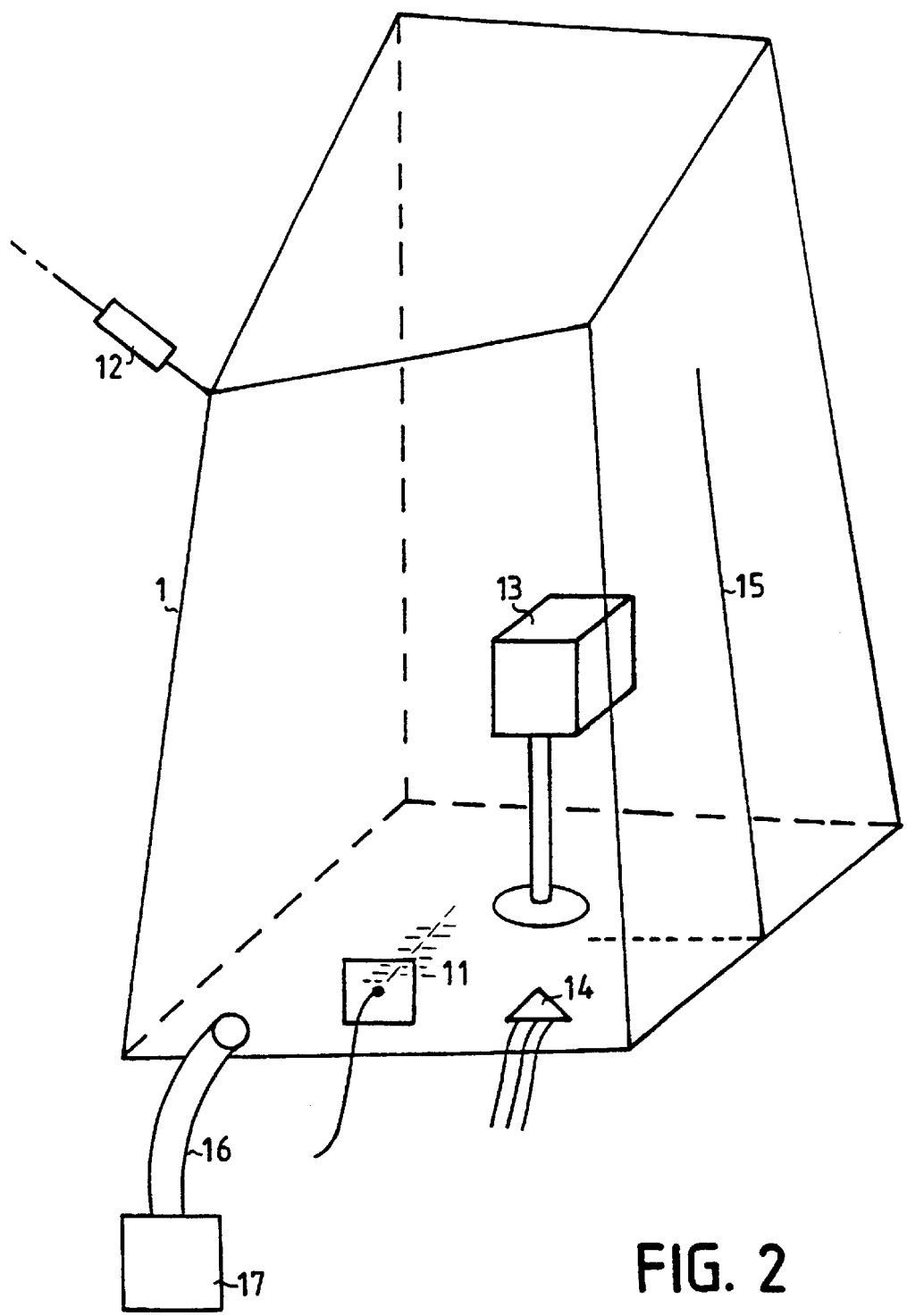
FIG. 2 represents a second possible embodiment of a test chamber according to the invention.

FIG. 2 shows a second possible embodiment of a test chamber according to the invention in which test chamber 1 is also realized as a tent made of woven aluminium fabric. Test chamber 1 is provided with a hose 16 to be connected to an air pump 17 for causing the tent to stay in shape once it has been put up. Test chamber 1 is provided with a vibrator 12, on one side attached to one of the corner joints of test chamber 1 and on another side attached, via a connecting cable, to a reference point, e.g. a building or a pole.

Also in this embodiment, test chamber 1 may be implemented with an opening in the centre of the ground sheet. Apparatus 13 can first be positioned on a metal plate (not shown), after which test chamber 1 can be set up around apparatus 13. Because in this embodiment, the connection between the tent fabric and the tent must be gastight to a certain extent, use can be made of conductive slide fasteners with one fastener element attached to the aluminium plate to interlock with the second fastener element around the opening in the ground sheet.

What is claimed is:

1. Test chamber in which objects to be tested can be exposed to an electromagnetic radiation field, or in which electromagnetic radiation emitted by objects to be tested can be measured, comprising means for coupling in/coupling out of electromagnetic radiation and means for distributing the electromagnetic radiation uniformly throughout the test chamber, wherein the test chamber possesses a reverberation chamber-geometry, wherein the test chamber walls are made of an electrically-conductive material, and wherein the means for the uniform distribution of the electromagnetic radiation are configured to move, in an operating mode, at least one part of a wall of the test chamber.

2. Test chamber as claimed in claim 1, characterized in that the means for moving at least one part of a wall are designed to cause at least one part of a wall to vibrate.

3. Test chamber as claimed in claim 2, characterized in that the wall is made of a conductive fabric.

4. Test chamber as claimed in claim 3, characterized in that the reverberation chamber is realized as a tent.

5. Test chamber as claimed in claim 4, characterized in that a frame is provided within which the reverberation chamber can be suspended from the frame's corner joints.

6. Test chamber as claimed in claim 4, characterized in that the tent is provided with a connection for a pressure gas, for creating an overpressure in the tent.

7. Test chamber as claimed in claim 6, characterized in that the means for moving at least one part of a wall are realized as a vibrator, in the operating mode attached to one of the tent's corner joints.

8. Test chamber as claimed in claim 7, characterized in that drive means are provided for actuating, in the operating mode, the vibrator at a frequency of 5–20 Hz.

9. Test chamber as claimed in claim 1, characterized in that the wall is made of a conductive fabric.

10. Test chamber as claimed in claim 9, characterized in that the reverberation chamber is realized as a tent.

11. Test chamber as claimed in claim 10, characterized in that a frame is provided within which the reverberation chamber can be suspended from the frame's corner joints.

12. Test chamber as claimed in claim 10, characterized in that the tent is provided with a connection for a pressure gas, for creating an overpressure in the tent.

13. Test chamber as claimed in claim 11, characterized in that the means for moving at least one part of a wall are realized as a vibrator, in the operating mode attached to one of the tent's corner joints.

14. Test chamber as claimed in claim 13, characterized in that drive means are provided for actuating, in the operating mode, the vibrator at a frequency of 5–20 Hz.

* * * * *